(12) United States Patent
Ren et al.

(10) Patent No.: US 9,305,831 B2
(45) Date of Patent: Apr. 5, 2016

(54) INTEGRATED METAL SPACER AND AIR GAP INTERCONNECT

(71) Applicant: Applied Materials, Inc., Santa Clara, CA (US)

(72) Inventors: He Ren, San Jose, CA (US); Mehul B. Naik, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/657,827

(22) Filed: Mar. 13, 2015

(65) Prior Publication Data

US 2015/0279726 A1 Oct. 1, 2015

Related U.S. Application Data

(60) Provisional application No. 61/973,499, filed on Apr. 1, 2014.

(51) Int. Cl.

| | | |
|---|---|---|
| *H01L 21/764* | (2006.01) | |
| *H01L 21/768* | (2006.01) | |
| *H01L 21/3205* | (2006.01) | |
| *H01L 21/311* | (2006.01) | |
| *H01L 21/02* | (2006.01) | |
| *H01L 21/3105* | (2006.01) | |

(52) U.S. Cl.
CPC .... *H01L 21/76802* (2013.01); *H01L 21/02126* (2013.01); *H01L 21/02271* (2013.01); *H01L 21/31055* (2013.01); *H01L 21/31111* (2013.01); *H01L 21/32051* (2013.01); *H01L 21/32053* (2013.01); *H01L 21/764* (2013.01); *H01L 21/7682* (2013.01); *H01L 21/76834* (2013.01); *H01L 21/76838* (2013.01)

(58) Field of Classification Search
CPC ............... H01L 21/02109; H01L 21/02225; H01L 21/0226
See application file for complete search history.

(56) References Cited

U.S. PATENT DOCUMENTS

| | | |
|---|---|---|
| 6,329,279 B1 | 12/2001 | Lee |
| 7,649,239 B2 | 1/2010 | Hussein et al. |
| 2004/0147106 A1 | 7/2004 | Okada |

(Continued)

FOREIGN PATENT DOCUMENTS

JP 2009123840 A 6/2009

OTHER PUBLICATIONS

International Search Report and Written Opinion for International Application No. PCT/US2015/018528.

*Primary Examiner* — Cheung Lee
(74) *Attorney, Agent, or Firm* — Patterson & Sheridan, LLP

(57) ABSTRACT

Embodiments described herein relate to methods for forming an air gap interconnect. A metal spacer layer is conformally deposited on a substrate having mandrel structures formed thereon. The metal spacer layer is etched to form spacer features and the mandrel structures are removed from the substrate. Various other dielectric deposition, patterning and etching steps may be performed to desirably pattern materials present on the substrate. Ultimately, a trench is formed between adjacent spacer features and a capping layer is deposited over the trench to form an air gap between the adjacent spacer features. For packaging purposes, an interconnect via may be configured to contact at least one of the spacer features adjacent the air gap.

20 Claims, 9 Drawing Sheets

(56) References Cited

U.S. PATENT DOCUMENTS

| | | |
|---|---|---|
| 2005/0062165 A1 | 3/2005 | Saenger et al. |
| 2008/0254600 A1 | 10/2008 | Liu et al. |
| 2008/0299763 A1 | 12/2008 | Ueki et al. |
| 2009/0072409 A1 | 3/2009 | Nitta et al. |
| 2009/0075470 A1 | 3/2009 | Nitta et al. |
| 2010/0248471 A1 | 9/2010 | Nam et al. |
| 2011/0291281 A1 | 12/2011 | Huang et al. |
| 2012/0070957 A1 | 3/2012 | Mallick et al. |

INTEGRATED METAL SPACER AND AIR GAP INTERCONNECT

CROSS-REFERENCE TO RELATED APPLICATIONS

This application claims benefit of U.S. Provisional Patent Application Ser. No. 61/973,499, filed Apr. 1, 2014, the entirety of which is herein incorporated by reference.

BACKGROUND

1. Field

Embodiments described herein generally relate to methods for forming a semiconductor device having an air gap. More specifically, embodiments described herein relate to an integrated metal spacer and air gap interconnect.

2. Description of the Related Art

For advanced node technologies, interconnect RC delay (switching performance) and power dampening due to capacitance are critical thresholds of device performance. Given the scaling performance limitations of conventional low-k materials in lowering the dielectric constant (k value) as a result of compromising mechanical strength and current leakage performance, one promising candidate for capacitance scaling includes the adoption of air gaps between metal wiring. Air gaps, which have a k value near 1.0, help reduce the overall effective k value to acceptable levels within the device. However, air gap integration requires additional processing steps, including exclusion mask lithography, dielectric recess, liner deposition, dielectric deposition, dielectric chemical mechanical polishing (CMP), etc. These additional steps increase the cost of integrating air gaps and reduce the benefits and acceptance of air gap technologies.

In addition, double patterning is generally utilized instead of single print patterning to form air gaps. Some examples of double patterning include litho-etch-litho-etch (LELE) and spacer aligned double patterning (SADP). These double patterning techniques not only require additional exposure and etch processes, but also require masks to define connectors and line ends. The double patterning processes transfer the desired design to the final product, but do so with increased cost and reduced efficiency.

Thus, what is needed are improved methods for forming air gap interconnect structures.

SUMMARY

In one embodiment, a method of forming a semiconductor device is provided. The method comprises conformally depositing a metal spacer layer over a mandrel structure and etching at least a portion of the metal spacer layer to form one or more spacer features. The mandrel structure is removed, a dielectric layer is deposited over the spacer features and the dielectric layer is patterned and etched between adjacent spacer features. A capping layer is then non-conformally deposited over the spacer features to form an air gap between the adjacent spacer features.

In another embodiment, a method of forming a semiconductor device is provided. The method comprises conformally depositing a metal spacer layer over a mandrel structure and etching at least a portion of the metal spacer layer to form one or more spacer features. The mandrel structure is removed, a flowable dielectric layer is deposited over the metal spacer layer and a first region of the flowable dielectric layer is patterned. The flowable dielectric layer and at least one of the spacer features are then etched to form a first trench and the flowable dielectric layer is re-deposited in the first trench. A second region of the flowable dielectric layer is patterned and etched between adjacent spacer features to form a second trench. A capping layer is non-conformally deposited over the spacer features, the second trench and the flowable dielectric layer to form an air gap in the second trench. Finally, at least a portion of the capping layer and the flowable dielectric layer are planarized.

In yet another embodiment, a method of forming a semiconductor device is provided. The method comprises providing a substrate having an oxide mandrel structure formed thereon and conformally depositing a metal spacer layer over the oxide mandrel structure. At least a portion of the metal spacer layer is etched to form one or more spacer features. The mandrel structure is etched, a flowable dielectric layer is deposited over the metal spacer layer and a first region of the flowable dielectric layer is patterned. The flowable dielectric layer and at least one of the spacer features in the first region are etched to form a first trench and the flowable dielectric layer is re-deposited in the first trench. A second region of the flowable dielectric layer is patterned and the flowable dielectric layer between adjacent spacer features in the second region is etched to form a second trench. A silicon containing capping layer is deposited over the spacer features, the second trench and the flowable dielectric layer to form an air gap in the second trench. At least a portion of the capping layer and the flowable dielectric layer are polished to form a planarized surface and an interconnect is formed through the substrate to at least one of the spacer features adjacent the air gap.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to methods for forming an air gap interconnect. A metal spacer layer is conformally deposited on a substrate having mandrel structures formed thereon. The metal spacer layer is etched to form spacer features and the mandrel structures are removed from the substrate. Various other dielectric deposition, patterning and etching steps may be performed to desirably pattern materials present on the substrate. As a result of the processing sequence, a trench is formed between adjacent spacer features and a capping layer is deposited over the trench to form an air gap between the adjacent spacer features. For packaging purposes, an interconnect via may be configured to contact at least one of the spacer features adjacent the air gap.

The formation sequences described in detail below depict partial views of a semiconductor device at various stages of manufacture. In addition to forming an air gap interconnect, it is contemplated that the methods described below may be utilized to form air gaps for implementation beyond interconnect technologies. The sequences described below provide one embodiment of forming an air gap interconnect, however, it should be known that various operations of the formation sequence may be rearranged in sequence, deleted, repeated, or performed in any combination thereof.

Figure 1:
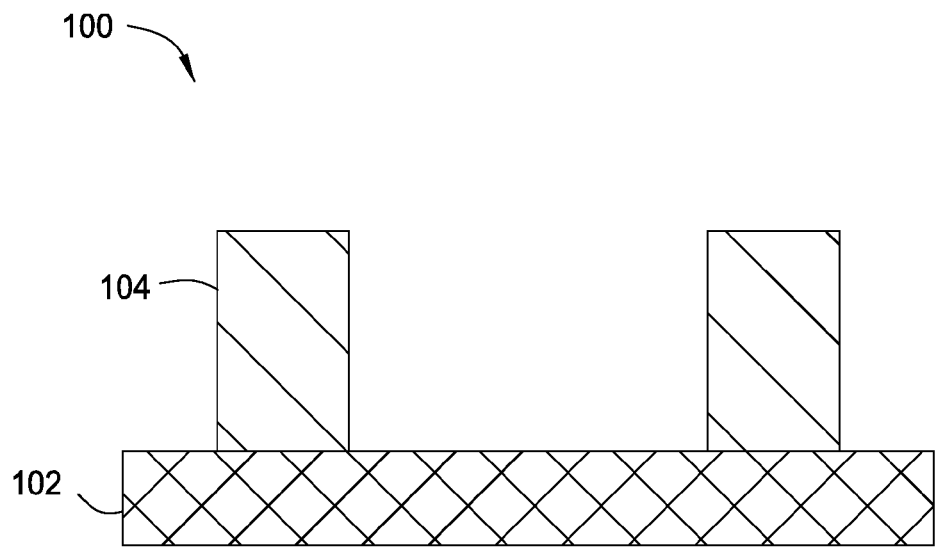
FIGS. 1-15 are schematic, cross-sectional views of a substrate illustrating a sequence of forming an air gap interconnect according to one embodiment disclosed herein.

FIG. 1 illustrates a schematic, cross-sectional view of a device structure 100. The device structure 100 includes a substrate 102 and one or more mandrel structures 104 formed on the substrate 102. In one embodiment, the substrate 102 includes an etch stop layer and may be formed from various materials, such as SiN, SiCN, SiOC, SiON, Si, C, O, N, metal nitrides, for example, AlN, and combinations thereof. The mandrel structures 104 are spaced apart from each other to define a template for subsequently deposited materials. The mandrel structures 104 are formed from oxide or silicon containing materials. For example, the mandrel structures 104 may be formed from silicon dioxide or polysilicon.

Figure 2:
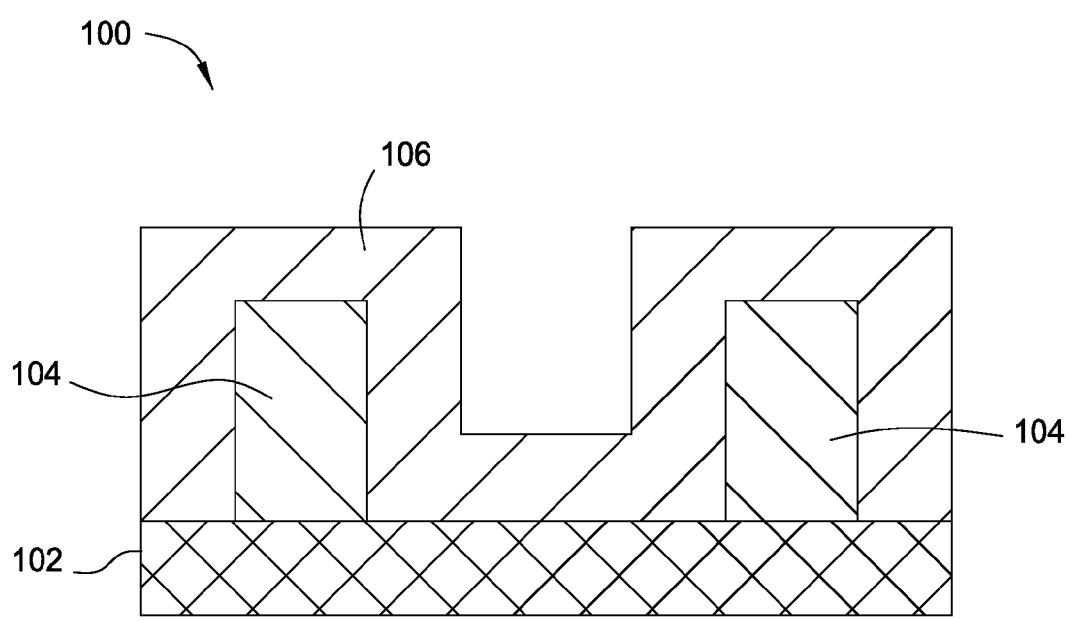

FIG. 2 is a schematic, cross-sectional view of the device structure 100 illustrating the result of a metal deposition process. A metal spacer layer 106 is conformally deposited over the substrate 102 and mandrel structures 104. Examples of materials utilized for the metal spacer layer 106 include metal organic chemical vapor deposited (MOCVD) tungsten, physical vapor deposited (PVD) metal silicides and chemical vapor deposited (CVD) metal silicides. Examples of suitable metal silicide materials include cobalt silicides, titanium silicides, nickel silicides, and combinations thereof.

The metal spacer layer material may be chose such that the metal spacer layer 106 reacts with the mandrel structure 104 material to form the final metal wiring of the device structure 100. After the metal spacer layer 106 has been deposited, a post deposition silicidation process may be performed to encourage a metal spacer layer 106/mandrel structure 104 reaction. The resulting mandrel structure 104 maintains dielectric properties while the metal spacer layer 106 is formed into a low-resistivity conductor.

Examples of suitable mandrel structure material and metal spacer layer material combinations include oxides/MOCVD tungsten, polysilicon/MOCVD tungsten and oxides or silicon/silicide. The metal spacer layer material may also comprise nickel, cobalt, and tungsten, among others. The metal spacer layer 106, which is conformally deposited over the mandrel structures 104, form the metal interconnect wiring, thus, reducing or eliminating the necessity for conventional metal gap fill in conventional air gap interconnect technologies. Moreover, patterning processes, described in greater detail below, are performed directly on the final metal wiring (metal spacer layer 106) which reduces or eliminates the necessity of pattern transfer (etch) steps for air gap interconnect formation.

Figure 3:
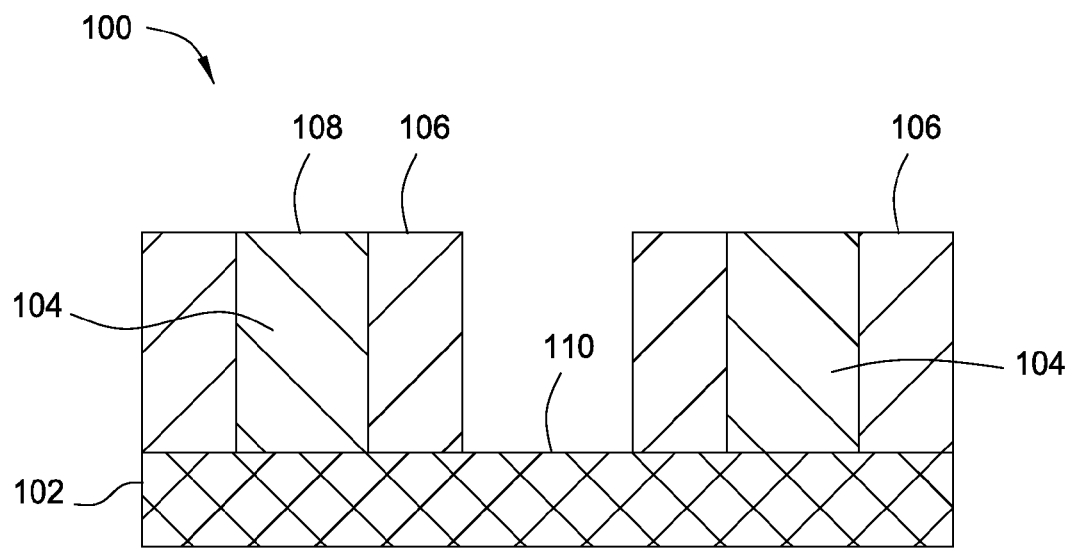

FIG. 3 is a schematic, cross-sectional view of the device structure 100 illustrating the result of an etching process. The metal spacer layer 106 is anisotropically etched to remove portions of the metal spacer layer 106. In one example, an anisotropic dry plasma etching process may be utilized. If the metal spacer layer 106 comprises tungsten, a $CF_4$ dry plasma may be utilized to etch the metal spacer layer 106. In this example, a $CF_4$ precursor gas may be flowed at a rate of between about 50 sccm to about 200 sccm in an environment having a pressure of between about 10 mT and about 50 mT. The $CF_4$ may be energized into a plasma with an RF power of between about 200 W and about 400 W and a bias of between about 100 W and about 500 W. One example of a processing chamber which may be utilized to perform the etching processes described is the MESA™ etch chamber available from Applied Materials, Inc., Santa Clara, Calif. However, it is contemplated that other similarly configured chamber from other manufacturers may also perform the processes described.

As a result of the etch process, at least a portion of the metal spacer layer 106 is removed to expose a top surface 108 of the mandrel structures 104 and a surface 110 of the substrate 102. The etching of the metal spacer layer 106 may be time dependent, or end point controlled, to make the remaining portions of the metal spacer layer 106 co-planar with the top surface 108 of the mandrel structures 104. After etching the metal spacer layer 106, the previously continuous metal spacer layer 106 now comprises separate discrete structures. These structures may be referred to as spacer features 106. As used hereinafter, the term spacer features 107 and metal spacer layer 106 refer to the same material, however, the spacer features 107 are the post-etching form of the metal spacer layer 106.

Figure 4:
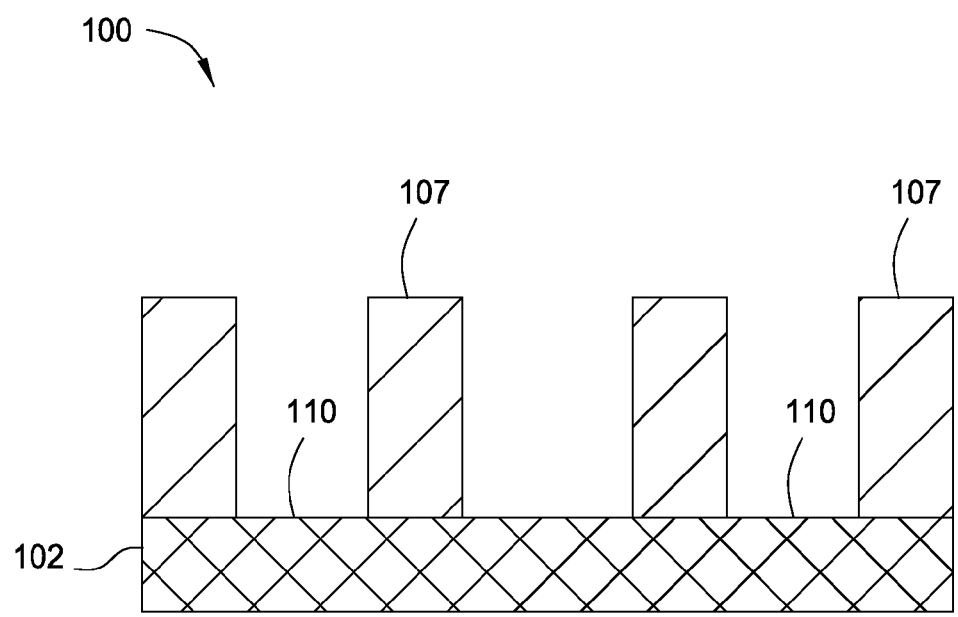

FIG. 4 is a schematic, cross-sectional view of the device structure 100 illustrating the result of an etching process. The mandrel structures 104 are etched utilizing a selective etching process which is non-reactive with the metal material of the spacer features 107. In one embodiment, a wet etching process utilizing a dilute HF solution is used to etch the mandrel structures 104. The wet etching process may proceed for an amount of time adequate to entirely remove the mandrel structures 104 from the substrate 102. In another embodiment, an anisotropic dry etching process utilizing $NF_3$ and $NH_3$ may be utilized to remove the mandrel structures 104. In this example, a $NF_3$ precursor gas may be flowed at a rate of between about 10 sccm and about 200 sccm and a $NH_3$ precursor gas may be flowed at a rate of between about 100 sccm and about 1000 sccm in an environment having a pressure of between about 200 mT and about 3000 mT. The $NF_3$ and $NH_3$ may be energized into a plasma with an RF power of between about 200 W and about 2000 W. The resulting device structure 100 includes the spacer features 107 spaced apart from one another by the exposed surface 110 of the substrate 102. The processes described in FIG. 1-4 complete the patterning of the metal spacer layer 106.

Figure 5:
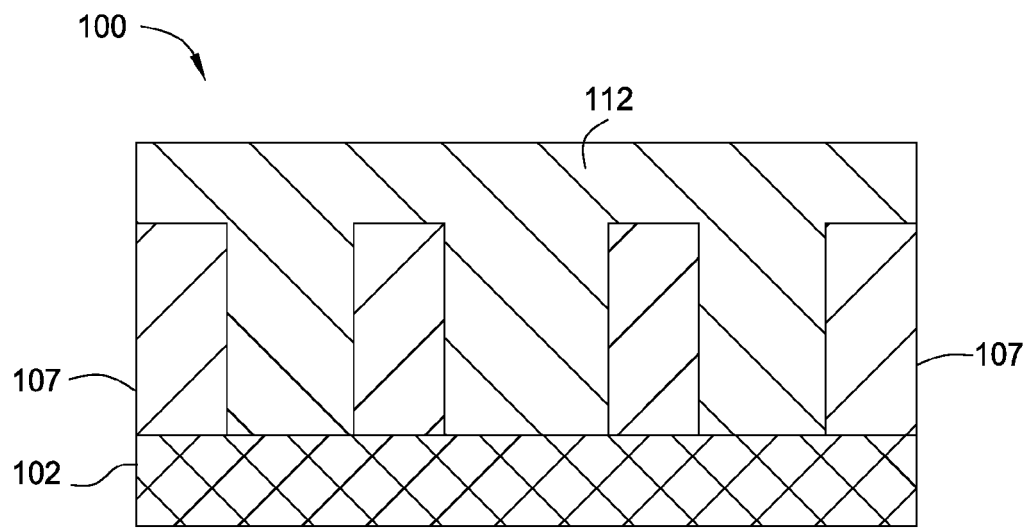

FIG. 5 is a schematic, cross sectional view of the device structure 100 illustrating the result of a flowable CVD deposition process. As illustrated, a dielectric layer 112 is deposited by a flowable or flow-like CVD process on the device structure 100 over the substrate 102 and the spacer features 107. The dielectric layer 112 is deposited in a blanket fashion such that the dielectric layer 112 fills the spaces between adjacent spacer features 107 and contacts the substrate 102. Due to the characteristics of the flowable dielectric layer 112, voids within the dielectric layer 112 are minimized or eliminated and a top surface of the dielectric layer 112 is substantially planar. The dielectric layer 112 is deposited with a thickness configured to extend above the spacer features 107.

In one example of a flowable CVD process, an organosilicon precursor and an oxygen precursor are reacted at a temperature of about 100° C. or less to form the dielectric layer 112. Suitable organosilicon precursors have a ratio of carbon atoms to silicon atoms less than about 8. Suitable organosilicon compounds may also have a ratio of oxygen to silicon atoms of about 0 to about 6, and may include an Si—O—Si linkage that facilitates formation of $SiO_x$ films with reduced contamination from carbon and hydroxyl groups. Suitable oxygen precursors may include molecular oxygen ($O_2$), ozone ($O_3$), a nitrogen-oxygen compound such as NO, $NO_2$, or $N_2O$, a hydrogen-oxygen compound such as water or peroxide, a carbon-oxygen compound such as carbon monoxide or carbon dioxide, and other oxygen-containing precursors. In one embodiment, the dielectric layer 112 comprises SiOCH and has a k value of between about 2.0 and about 3.0.

A carrier gas, for example, an inert gas, may also be provided with the organosilicon and oxygen precursors. The oxygen precursor may be activated prior to introduction to the chamber, for example using a remote plasma generator, which may include thermal dissociation, ultraviolet light dissociation, RF, DC, and/or microwave dissociation. In one embodiment, 4-6 kW of RF power may be coupled into a flow of 900-1,800 sccm of argon and 600-1,200 sccm of molecular oxygen. The organosilicon precursor may be provided to the chamber separately from the oxygen precursor to prevent reactions outside the chamber. The organosilicon precursor may be introduced as a gas to the chamber at a liquid-equivalent flow rate of about 800 mgm to about 1,600 mgm. Helium may be included as a carrier gas at a flow rate of about 600 sccm to about 2,400 sccm. An activated oxygen precursor may be introduced to the chamber at a flow rate between about 3 sLm and about 20 sLm.

The precursors react to deposit a flowable oxide layer, or dielectric layer 112, on the substrate 102. The CVD process described above may be implemented on the PRODUCER® ETERNA™ FCVD system available from Applied Materials, Inc., of Santa Clara, Calif. However, it is contemplated that other similarly configured chambers from other manufacturers may also perform the processes described.

Figure 6:
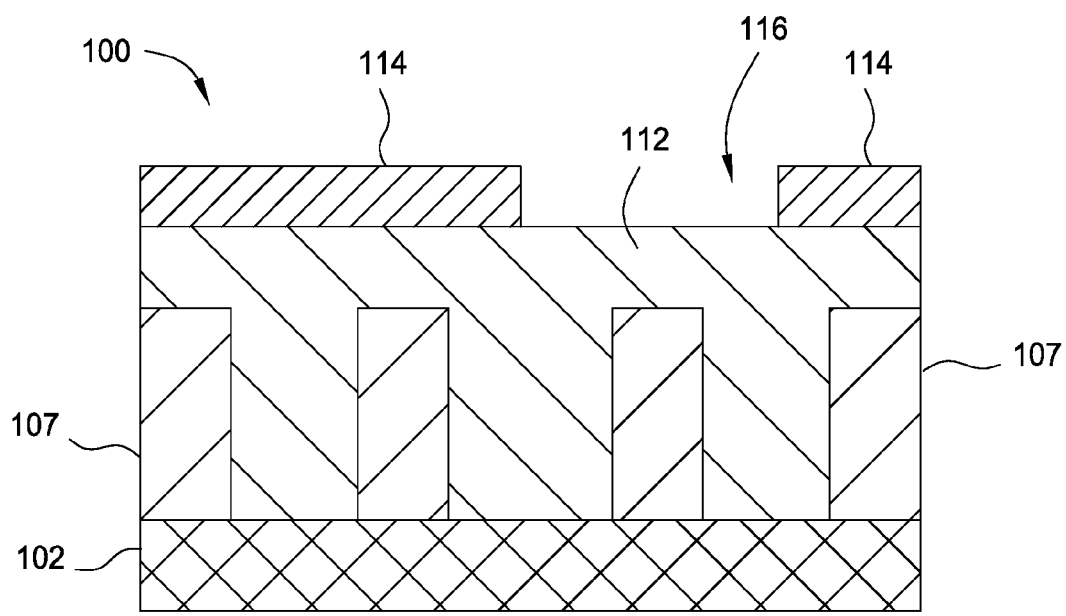

FIG. 6 is a schematic, cross-sectional view of the device structure 100 illustrating the result of a mask formation and patterning process. A first mask 114, such as a photoresist material, is deposited on the dielectric layer 112 and subsequently patterned. The first mask 114 may be a photosensitive polymer material which is blanket deposited on the dielectric layer 112. The first mask 114 is patterned to form an exposed first region 116. In one embodiment, a 193 nm immersion lithography process is utilized to pattern the first mask 114 and expose the first region 116. The first mask 114 is removed within the first region 116 and the dielectric layer 112 is exposed. In one embodiment, at least one of the spacer features 107 is included below in the first region 116. In one example, the first region 116 defines a line end which will be subsequently removed from the device structure 100.

Figure 7:
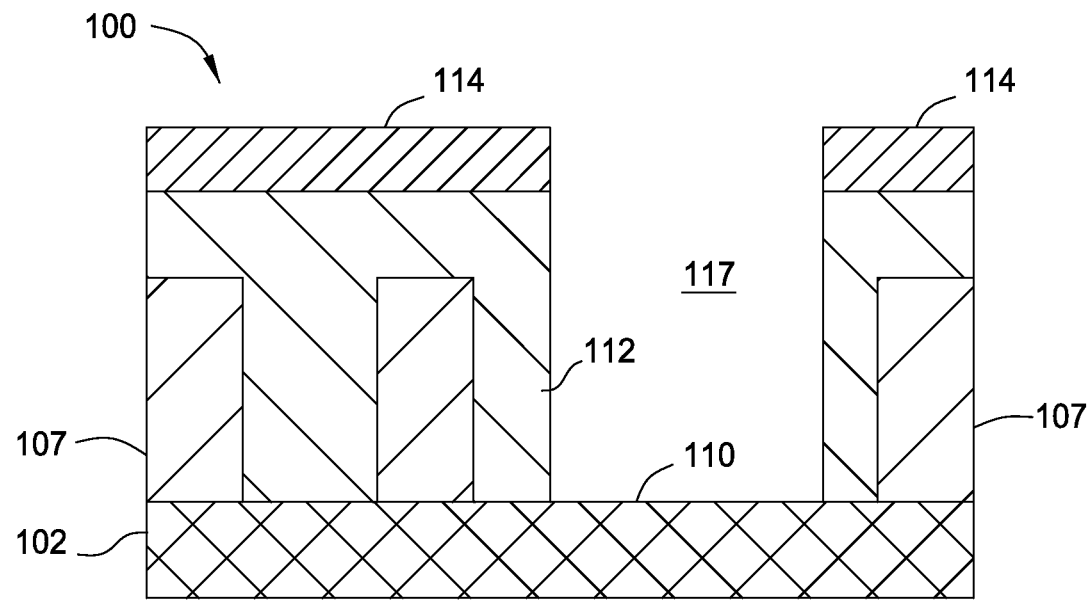

FIG. 7 is a schematic, cross-sectional view of the device structure 100 illustrating the result of a line end removal process. An anisotropic etching process may be utilized to remove the materials within the first region 116 (See FIG. 6) to form a first trench 117. Various etching techniques, including wet etching and dry plasma etching techniques, may be utilized. In this example, one or more etchants are utilized to remove the dielectric layer 112 and spacer features 107 in the first region 116 to form the first trench 117. For example, a single etchant may remove both the dielectric layer 112 and the spacer feature 106 within the first region 116 or multiple etchants which are selective to either the dielectric layer 112 or the spacer features 107 may be utilized to form the first trench 117. A bottom of the first trench 117 is defined by the surface 110 of the substrate 102 and sidewalls of the first trench 117 are defined by the dielectric layer 112. By removing the spacer features 107 in the first region 116, the line ends of the device structure 100 are formed to create the desired wiring structure and further processing may proceed.

Figure 8:
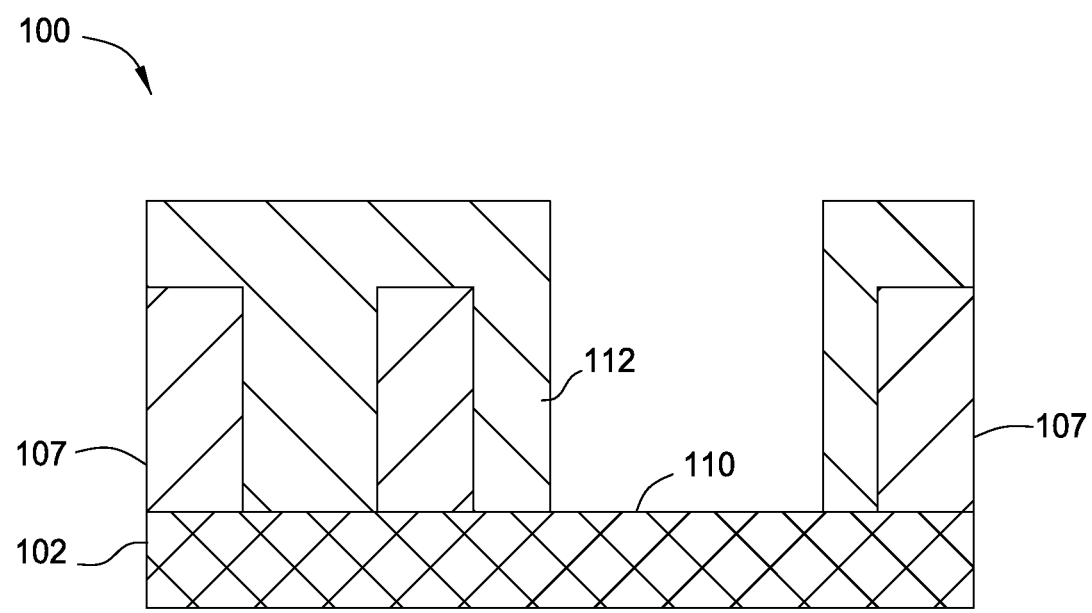

FIG. 8 is a schematic, cross sectional view of the device structure 100 illustrating the result of a mask removal process. As illustrated, the first mask 114 has been removed to expose the dielectric layer 112. The first mask 114 may be removed by various methods including ashing or etching the first mask 114. For example, the first mask 114 is removed via a wet clean process selective to the material of the dielectric layer 112.

Figure 9:
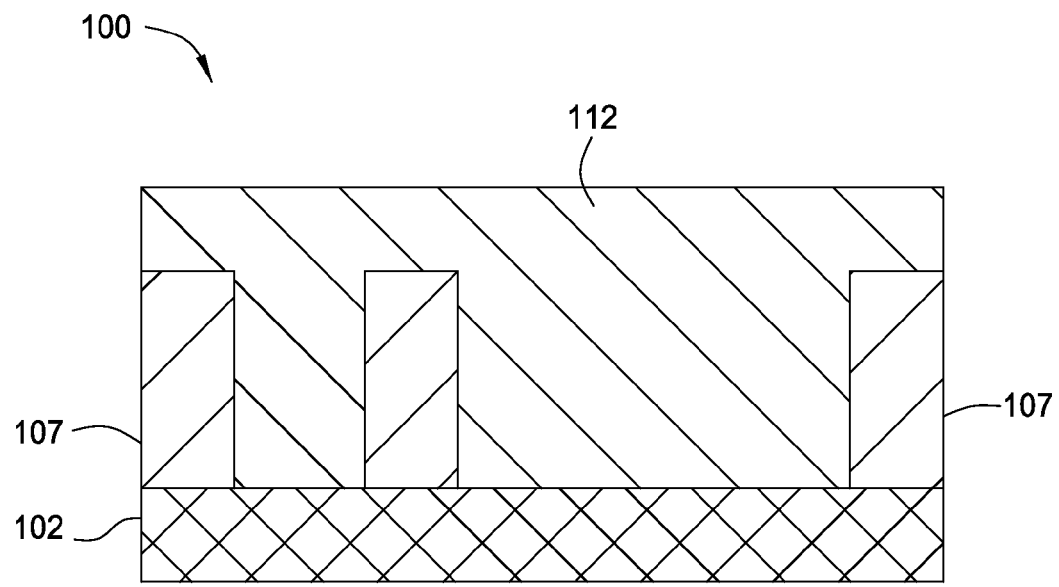

FIG. 9 is a schematic, cross-sectional view of the device structure 100 illustrating the result of a flowable dielectric deposition process. The first trench 117 is filled with the flowable dielectric layer 112 according to the processes described in detail with regard to FIG. 5. The resulting dielectric layer 112 has features similar to the initially deposited dielectric layer 112.

Figure 10:
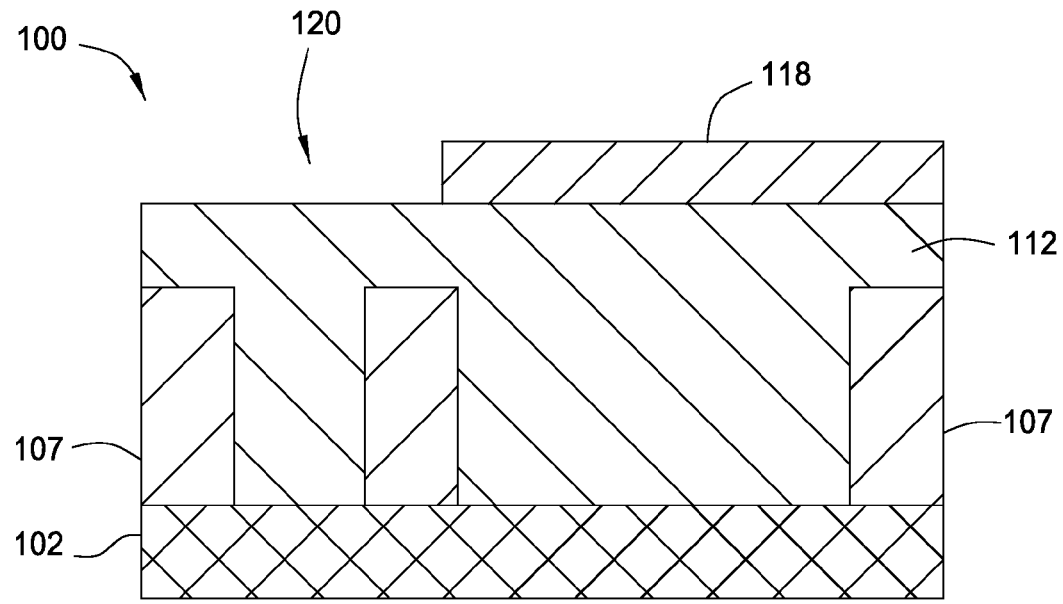

FIG. 10 is a schematic, cross-sectional view of the device structure 100 illustrating the result of a mask formation and patterning process. A second mask 118, which may be formed in a manner similar to the first mask 114, is deposited on the dielectric layer 112 and patterned to expose a second region 120. The second mask 118 may protect the previously exposed first region 116 and the subsequently deposited dielectric layer 112 which filled the first trench 117. The patterning of the second mask 118 is performed in a manner similar to the patterning of the first mask 114. In one embodiment, the first mask 114 and the second mask 118 may be separate masks or the same mask. If the first mask 114 and the second mask 118 form a single mask, the lithography process is made in a reverse tone resist so that the protected regions of the device structure 100 are complimentary. The second region 120 exposes at least a portion of the dielectric layer 112 disposed over adjacent spacer features 107.

Figure 11:
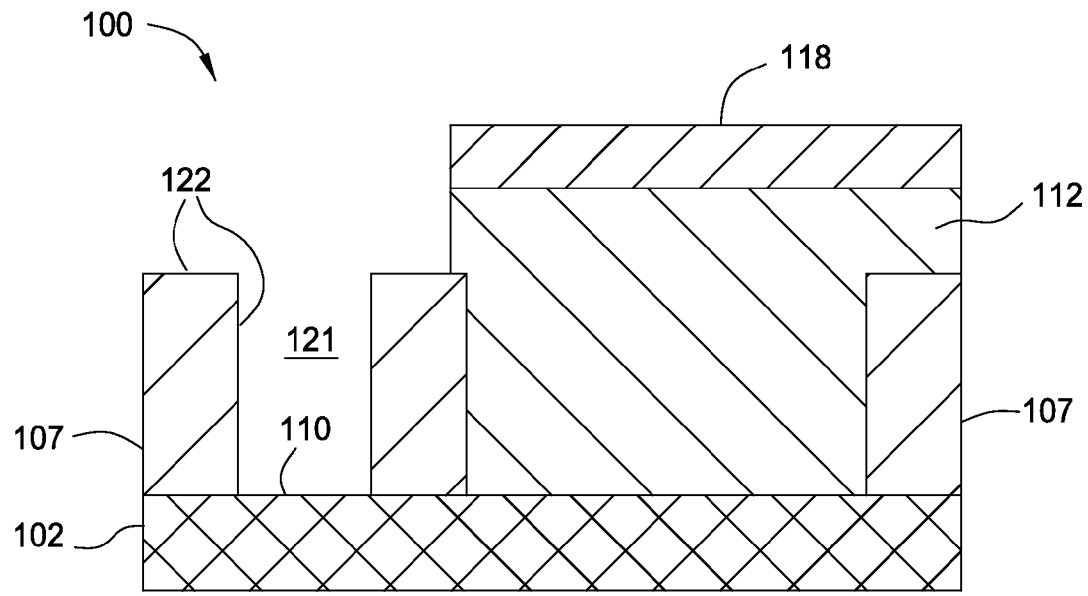

FIG. 11 is a schematic, cross-sectional view of the device structure 100 illustrating the result of a dielectric etch process. Here, the dielectric layer 112 in the second region 120 is etched to expose at least a portion of adjacent spacer features 106 and the surface of the substrate 102. As such, a second trench 121 is formed between the adjacent spacer features 106. The second trench 121 may have an aspect ratio between about 1.5:1.0 and about 5.0:1.0. The dielectric layer 112 is etched using a passivated dry plasma etching process. The etchant species utilized may exhibit high selectivity between the dielectric layer 112 and the metal of the spacer features 106.

In one embodiment, $C_4F_6$ is utilized to etch the dielectric layer 112. In this example, a $C_4F_6$ precursor gas may be flowed at a rate of about 10 sccm in an environment having a pressure of about 200 mT. The $C_4F_6$ may be energized into a plasma with an RF power of between about 100 W and about 2000 W and a bias of between about 50 W and about 500 W. The etchant species are preferably selected to protect exposed surfaces 122 of the spacer features 107 while etching the dielectric layer 112. Similarly, the etchant species are selective to the substrate 102 and are selected to etch the dielectric layer 112. In one embodiment, a dielectric liner may be deposited to passivate the exposed surfaces 122 of the spacer features 107. The dielectric liner may comprise materials such as Si, O, C, N, H, and combinations thereof.

Figure 12:
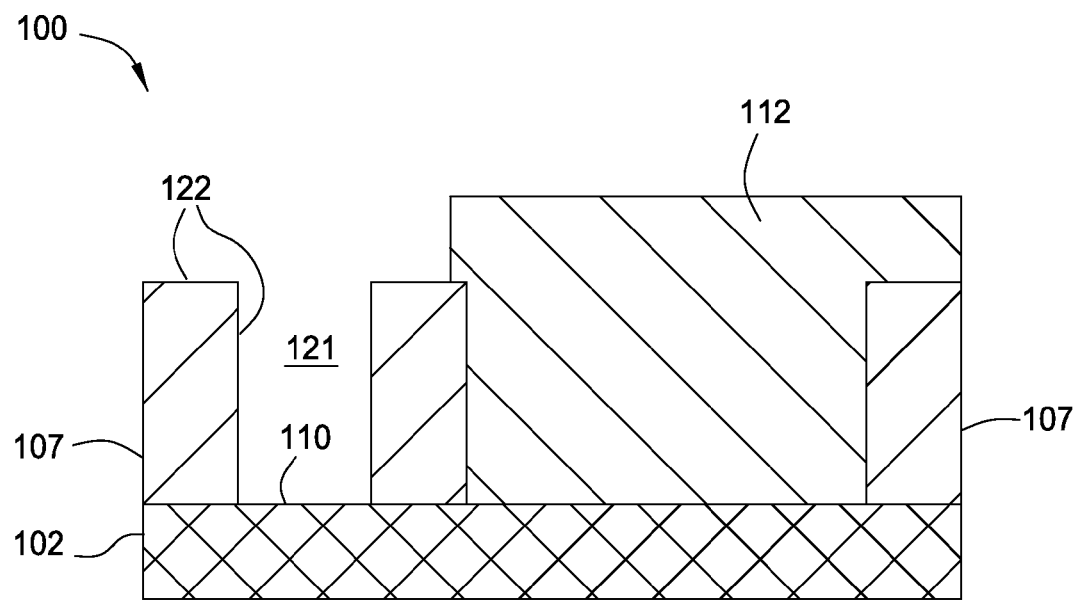

FIG. 12 is a schematic, cross-sectional view of the device structure 100 illustrating the result of a mask removal process. As illustrated, the second mask 118 is removed to expose the dielectric layer 112. The second mask 118 may be removed by a process similar to the processes utilized to remove the first mask 114.

Figure 13:
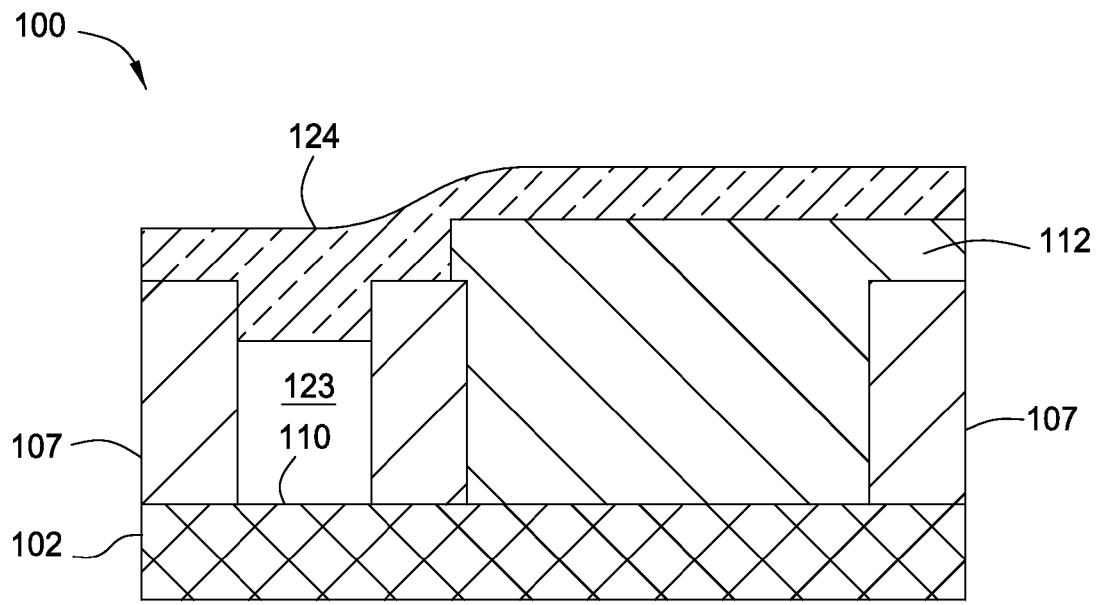

FIG. 13 is a schematic, cross-sectional view of the device structure 100 illustrating the result of a capping layer deposition process. A capping layer 124 is deposited on the device structure 100 over at least a portion of the exposed surfaces 122 of the spacer features 107 adjacent the second trench 121 (See FIG. 12) and the dielectric layer 112. The capping layer 124 comprises a low-k silicon containing material. For example, the capping layer 124 material may comprise SiOC, SiOCN, SiCN, or the like.

In one embodiment, SiOC is utilized as the capping layer 124. In this example, an organosilicon containing precursor gas may be flowed at a rate of between about 50 sccm and about 500 sccm and an oxygen containing precursor may be flowed at a rate of between about 200 sccm and about 1000 sccm in an environment having a pressure of between about 1000 mT and about 3000 mT. The precursors may be energized into a plasma with an RF power of between about 500 W and about 2000 W. In one example, the capping layer 124 deposition is a surface curvature dependent blanket deposition process which bridges the second trench 121. The deposition process may be a time dependent CVD process.

The capping layer 124 deposition is configured to deposit material within a portion of the second trench 121. As such, the capping layer 124 may entirely cover a top exposed surface 122 of the spacer features 106 adjacent the second trench 121 and only a portion of the sidewall exposed surface 122 of the spacer features 106 adjacent the second trench 121. The capping layer 124 deposition process is configured to prevent deposition of the capping layer 124 on the surface 110 of the substrate 102. As a result, an air gap 123 is formed in the second trench 121 between the adjacent spacer features 107. The air gap 123 may be defined by the adjacent spacer features 107, the substrate 102 and the capping layer 124. The air gap 123 is substantially devoid of any material other than air.

Figure 14:
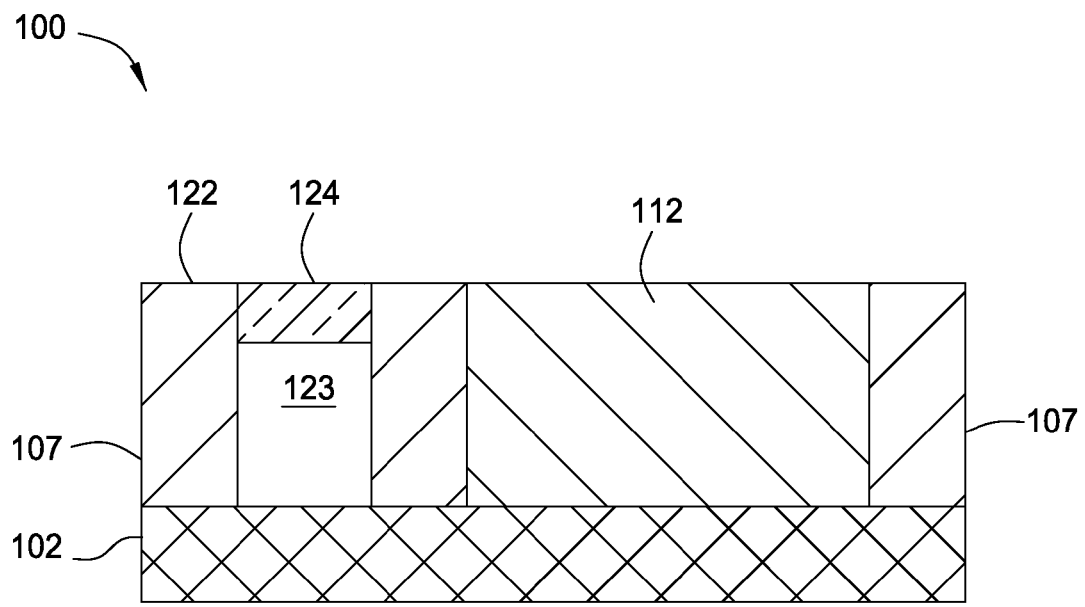

FIG. 14 is a schematic, cross-sectional view of the device structure illustrating the result of a CMP process. The previously deposited dielectric layer 112 and capping layer 124 may have a non-uniform thickness across the surface of the device structure 100. A CMP process, or other planarizing process, is performed to planarize the top surface of the device structure 100 such that the spacer features 106, dielectric layer 112, and capping layer 124 are substantially co-planar. In one embodiment, the spacer features 107 may be utilized as a hard stop to determine the planarizing/polishing end point. The CMP process may be implemented on a REFLEXION GT™ system or other compatible CMP systems available from Applied Materials, Inc., Santa Clara, Calif. Planarizing systems from other manufacturers may also be used to perform the processes described.

The CMP processing results in the device structure 100 having a planarized upper surface with a remaining capping layer 124 portion disposed in the upper portion of the second trench 121 to define the air gap 123 there below. The CMP process may be performed only once in this air gap integration scheme, thus, eliminating the necessity of multiple CMP processes for metal CMP and dielectric CMP in conventional air gap integration schemes.

Figure 15:
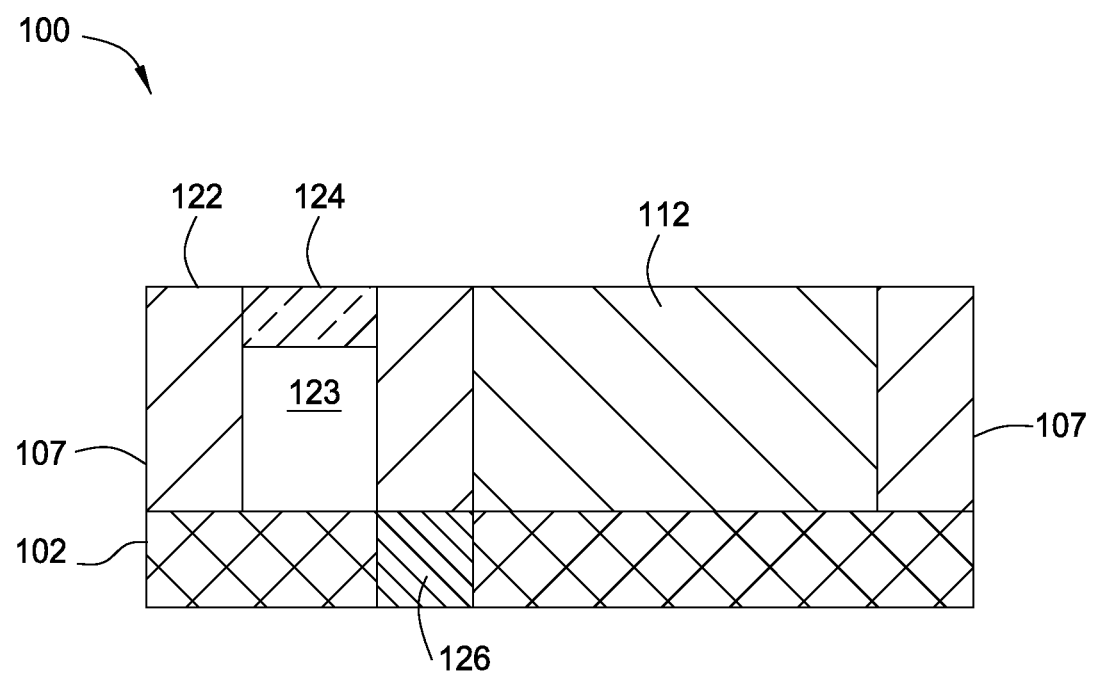

FIG. 15 is a schematic, cross-sectional view of the device structure 100 illustrating the result of an interconnect formation process. The interconnect 126 is formed at least through the substrate 102 to one of the spacer features 107, which are electrically conductive, adjacent the air gap 123. A via (not shown) may be formed by an etching or ablation process and the resulting via may be filled with interconnect material. The interconnect 126 may be a conductive material, such as a metal or metal silicide, and may be deposited by various processes, including CVD, PVD, atomic later deposition (ALD) and epitaxial deposition, among others. The interconnect 126 electrically connects the spacer features 107 to other components of the semiconductor device and may be utilized during semiconductor packaging processes.

Figure 16:
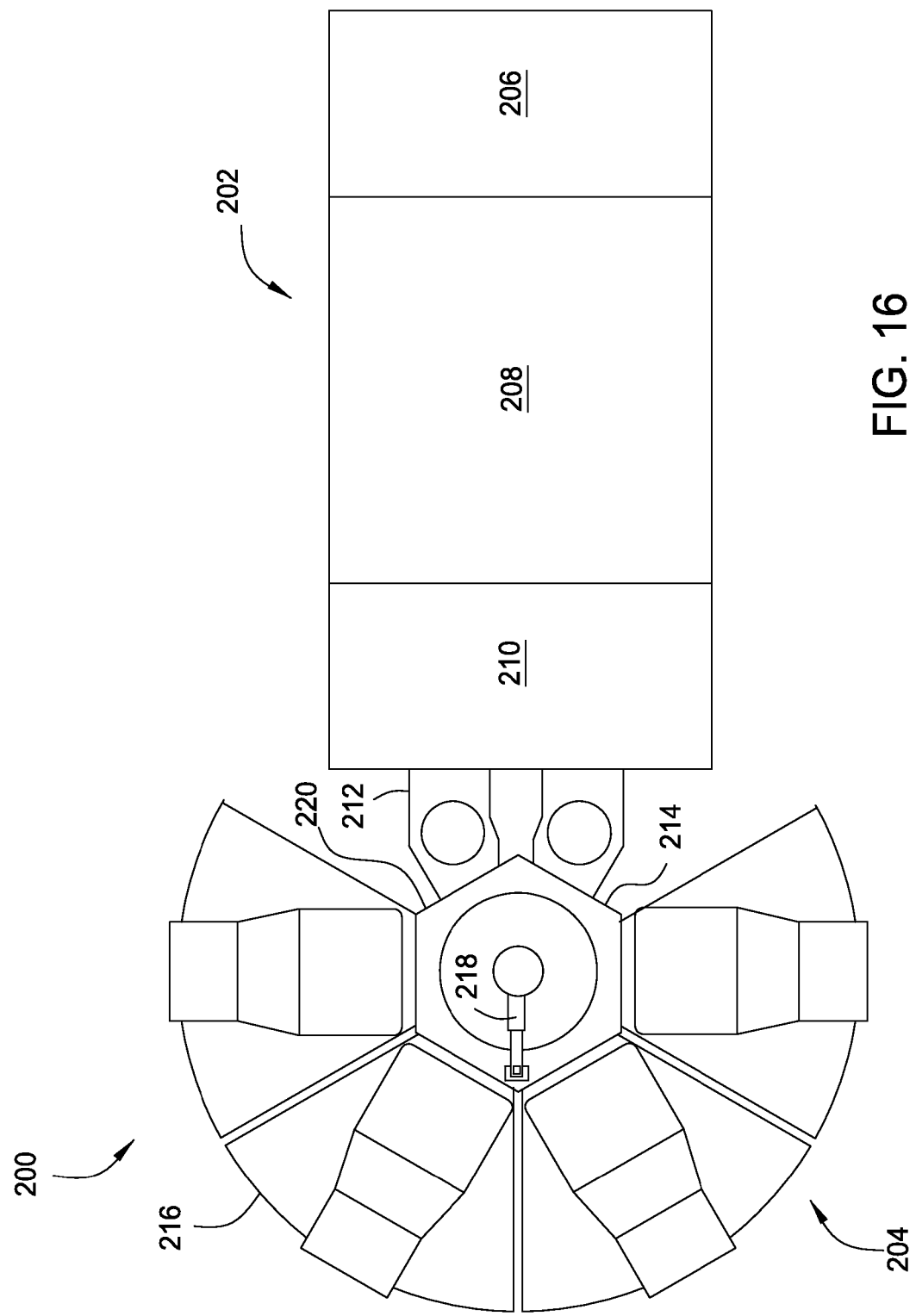
FIG. 16 is a schematic plan view of an apparatus which may be used to perform various processes described herein.

FIG. 16 is a schematic plan view of an apparatus 200 that may be utilized to perform the various processes described herein. The apparatus 200 comprises a substrate handling portion 202 and a substrate processing portion 204. The substrate handling portion 202 comprises a loading station 206, a transfer station 208, and an interface station 210. Substrates are loaded into the apparatus 200 at the loading station 206. In some cases, the loading operation may comprise disposing one or more substrates on a carrier for transport through the apparatus 200. The transfer station 208 moves substrates from the loading station 206 to the interface station 210. The transfer station 208 may comprise substrate handling features, such as flippers, if desired. The interface station 208 provides substrates to an entry load-lock chamber 212 for entry to the substrate processing portion 204, which generally operates under vacuum. The substrate processing portion 204 comprises a plurality of substrate processing chambers 216 coupled to a transfer chamber 220 with a transfer robot 218 disposed therein. Each of the processing chambers 216 may be an ALD chamber, a low temperature CVD chamber, a high-density plasma CVD chamber, a PECVD chamber, an etch chamber, or a plasma cleaning chamber. In one embodiment, the chambers 216 include a plasma CVD chamber that forms a flowable dielectric layer, and a plasma etch chamber that can etch silicon layers, oxide layers and/or metal layers. The plasma CVD chamber may be an HDP CVD chamber, and the plasma etch chamber may be a remote plasma chamber. An exit load-lock chamber 214 receives processed substrates for transfer back to the substrate handling portion 202.

In embodiments featuring a plurality of substrates disposed on a substrate carrier for processing, each of the processing chambers 216 may process a plurality of substrates at the same time. When the apparatus 200 is used to practice the methods described above, any or all of processes may be performed on a plurality of substrates simultaneously.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a semiconductor device, comprising:
   conformally depositing a metal spacer layer over a mandrel structure;
   etching at least a portion of the metal spacer layer to form spacer features;
   removing the mandrel structure;
   depositing a dielectric layer over the spacer features;
   patterning the dielectric layer;
   passivatively etching the dielectric layer between adjacent spacer features; and
   non-conformally depositing a capping layer over the spacer features, wherein an air gap is formed between adjacent spacer features.

2. The method of claim 1, wherein the mandrel structure is an oxide material or a silicon containing material.

3. The method of claim 2, wherein the metal spacer layer comprises tungsten or metal silicide materials.

4. The method of claim 1, wherein the metal spacer layer is selected from the group consisting of tungsten, cobalt and nickel.

5. The method of claim 4, wherein the metal spacer layer is formed by a MOCVD process.

6. The method of claim 1, wherein the dielectric layer is deposited by a flowable CVD process.

7. The method of claim 6, wherein the dielectric layer comprises a tunable low-k material.

8. The method of claim 7, wherein the dielectric layer comprises SiOCH.

9. The method of claim 1, wherein adjacent spacer features define a trench having an aspect ratio of between about 1.5:1 and about 5:1.

10. The method of claim 9, wherein an upper region of the trench is defined by the capping layer.

11. The method of claim 10, wherein the capping layer comprises a silicon containing material.

12. A method of forming a semiconductor device, comprising:
conformally depositing a metal spacer layer over mandrel structures;
etching at least a portion of the metal spacer layer to form spacer features;
removing the mandrel structures;
depositing a flowable dielectric layer over spacer features;
patterning a first region of the flowable dielectric layer;
etching the flowable dielectric layer and at least one of the spacer features to form a first trench;
re-depositing the flowable dielectric layer in the first trench;
patterning a second region of the flowable dielectric layer;
etching the flowable dielectric layer between adjacent spacer features to form a second trench;
non-conformally depositing a capping layer over the spacer features, the second trench and the flowable dielectric layer, wherein an air gap is formed in the second trench; and
planarizing at least a portion of the capping layer and the flowable dielectric layer.

13. The method of claim 12, further comprising forming an interconnect to at least one of the spacer features adjacent the air gap.

14. The method of claim 12, wherein planarizing comprises a dielectric CMP process.

15. The method of claim 14, wherein the spacer features define a stopping point for the planarizing.

16. The method of claim 12, wherein the capping layer extends into the second trench below a top surface of the spacer features.

17. The method of claim 16, wherein the capping layer comprises a silicon containing material.

18. The method of claim 12, wherein the second trench has an aspect ratio of between about 1.5:1 and about 5:1.

19. The method of claim 18, wherein an upper region of the second trench is defined by the capping layer.

20. A method of forming a semiconductor device, comprising:
positioning a substrate having oxide mandrel structures formed thereon in a processing chamber;
conformally depositing a metal spacer layer over the oxide mandrel structures;
anisotropically dry plasma etching at least a portion of the metal spacer layer to form spacer features;
etching the oxide mandrel structures;
depositing a flowable dielectric layer over the spacer features;
patterning a first region of the flowable dielectric layer;
etching the flowable dielectric layer and at least one of the spacer features in the first region to form a first trench;
re-depositing the flowable dielectric layer in the first trench;
patterning a second region of the flowable dielectric layer;
etching the flowable dielectric layer between adjacent spacer features in the second region to form a second trench;
non-conformally depositing a silicon containing capping layer over the spacer features, the second trench and the flowable dielectric layer, wherein an air gap is formed in the second trench;
planarizing at least a portion of the capping layer and the flowable dielectric layer to form a planarized surface; and
forming an interconnect through the substrate to at least one of the spacer features adjacent the air gap.

* * * * *